(12) United States Patent
Li et al.

(10) Patent No.: US 12,119,413 B2
(45) Date of Patent: Oct. 15, 2024

(54) SCHOTTKY DIODE WITH TUNABLE BLOCKING VOLTAGE

(71) Applicant: Allegro MicroSystems, LLC, Manchester, NH (US)

(72) Inventors: Yu-Chun Li, New Taipei (TW); Felix Palumbo, Buenos Aires (AR); Chung C. Kuo, Manchester, NH (US); Thomas S. Chung, Merrimack, NH (US); Maxim Klebanov, Palm Coast, FL (US)

(73) Assignee: Allegro MicroSystems, LLC, Manchester, NH (US)

( * ) Notice: Subject to any disclaimer, the term of this patent is extended or adjusted under 35 U.S.C. 154(b) by 326 days.

(21) Appl. No.: 17/819,957

(22) Filed: Aug. 16, 2022

(65) Prior Publication Data
US 2024/0063310 A1    Feb. 22, 2024

(51) Int. Cl.
*H01L 29/872* (2006.01)
*H01L 29/06* (2006.01)
*H01L 29/40* (2006.01)

(52) U.S. Cl.
CPC ........ *H01L 29/872* (2013.01); *H01L 29/0623* (2013.01); *H01L 29/402* (2013.01)

(58) Field of Classification Search
CPC . H01L 29/872; H01L 29/0623; H01L 29/402; H01L 29/0619; H01L 29/0649; H01L 29/0692; H01L 29/404; H01L 29/66143
See application file for complete search history.

(56) References Cited

U.S. PATENT DOCUMENTS

| | | | |
|---|---|---|---|
| 5,545,917 A | 8/1996 | Peppiette et al. | |
| 5,684,427 A | 11/1997 | Stoddard | |
| 8,610,371 B2 | 12/2013 | Lee et al. | |
| 9,318,481 B1 | 4/2016 | Wang et al. | |
| 9,929,141 B2* | 3/2018 | Kuo | H01L 27/0262 |
| 11,257,948 B2* | 2/2022 | Haynie | H01L 21/74 |
| 11,349,010 B2* | 5/2022 | Lin | H01L 21/26513 |
| 2009/0283841 A1* | 11/2009 | Yeh | H01L 27/0814 |
| | | | 257/E27.06 |
| 2012/0018837 A1* | 1/2012 | Anderson | H01L 29/872 |
| | | | 438/420 |

(Continued)

OTHER PUBLICATIONS

U.S. Appl. No. 17/662,101, filed May 5, 2022, Saxena, et al.
(Continued)

*Primary Examiner* — Shahed Ahmed
*Assistant Examiner* — Khatib A Rahman
(74) *Attorney, Agent, or Firm* — Daly, Crowley, Mofford & Durkee, LLP

(57) ABSTRACT

A Schottky diode includes a substrate having a first type dopant, a buried layer within the substrate and having a second type dopant, an epitaxial layer above the buried layer and having the second type dopant, a plurality of rings within the epitaxial layer and having the first type dopant, wherein the plurality of rings comprises an L-shaped ring, a shallow trench isolation (STI) layer at the top region of the epitaxial layer, an anode, a cathode spaced from the anode by the STI layer, and wherein the buried layer has an open region substantially vertically aligned with the anode.

10 Claims, 5 Drawing Sheets

(56) References Cited

U.S. PATENT DOCUMENTS

| | | | | |
|---|---|---|---|---|
| 2013/0001734 A1* | 1/2013 | Yang | ................ | H01L 29/872 |
| | | | | 257/E29.338 |
| 2015/0255595 A1* | 9/2015 | Hebert | ............ | H01L 27/0922 |
| | | | | 438/286 |
| 2016/0064475 A1* | 3/2016 | Feilchenfeld | ..... | H01L 21/76224 |
| | | | | 257/491 |
| 2018/0090562 A1* | 3/2018 | Lee | .................. | H01L 29/872 |
| 2020/0185542 A1* | 6/2020 | Lian | .................. | H01L 29/872 |

OTHER PUBLICATIONS

Mistele et al. "Integrated High-Voltage (HV) Schottky Diode for Power Management ICs", IEEE, 28-th Convention of Electrical and Electronics Engineers in Israel, 2014, 5 pages.

\* cited by examiner

SCHOTTKY DIODE WITH TUNABLE BLOCKING VOLTAGE

BACKGROUND

Bipolar-CMOS-DMOS (BCD) technology integrates bipolar transistors with complementary metal oxide semiconductor (CMOS) logic and double diffused metal-oxide-semiconductor (DMOS) transistors. High voltage BCD technology (e.g., with operating voltages in excess of 80V) is used to form circuit elements such as Schottky diodes.

Schottky diodes are used in various applications such as a transient voltage suppressor and protection of a power Metal Oxide Semiconductor Field Effect Transistor (MOSFET). Schottky diodes can have faster switching speed and lower forward voltage drop as compared to other high voltage switching solutions, such as P-N junction diodes. However, Schottky diodes can have a higher leakage current than P-N junction diodes.

SUMMARY

Described herein is a BCD Schottky diode construction including features designed to increase and control blocking voltage, including an L-shaped ring and a buried layer having an open region that is substantially vertically aligned with the anode. Dimensions and doping profiles, or concentrations of the L-shaped ring and the buried layer open region are adjustable to control the blocking voltage. Additional p-type rings and field plates further increase the blocking voltage.

According to the disclosure, a Schottky diode includes a substrate having a first type dopant, a buried layer within the substrate and having a second type dopant, an epitaxial layer above the buried layer and having the second type dopant, a plurality of rings within the epitaxial layer and having the first type dopant, wherein the plurality of rings comprises an L-shaped ring, a shallow trench isolation (STI) layer at the surface region of the epitaxial layer, an anode, a cathode spaced from the anode by the STI layer, and wherein the buried layer has an open region substantially vertically aligned with the anode.

Features may include one or more of the following alone or in combination. The L-shaped ring can cover a corner of the STI layer adjacent to the anode. A dimension of the L-shaped ring can be adjustable and a blocking voltage of the Schottky diode can be based at least in part on the dimension of the L-shaped ring. The dimension of the L-shaped ring can be a width of the L-shaped ring that extends under the STI layer. The open region of the buried layer can have an adjustable width and a blocking voltage of the Schottky diode can be based at least in part on the width of the open region. The Schottky diode can further include at least one field plate above the STI layer. The Schottky diode can further include at least one plug in contact with the buried layer. The first type dopant can be p-type and the second type dopant can be N-type. The substrate can be comprised of silicon. The substrate and the epitaxial layer are comprised of a crystalline semiconductor material, selected from silicon, Ge, AlGaN, InGaAs, GaAs, InAs, InP, AlN, InN, GaN, SiC, SiGe.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a Schottky diode and a resulting Schottky diode construction having features designed to achieve a relatively high breakdown voltage that is adjustable by controlling dimensions and other aspects such as doping profiles, or concentrations of various elements. As used herein, the terms "breakdown voltage" and "reverse breakdown voltage" are used interchangeably to describe the reverse bias voltage at or above which the Schottky diode conducts significant current in the reverse direction and is sometimes referred to alternatively as the "blocking voltage." In an example, a breakdown voltage on the order of 110 volts or greater can be achieved. The described high blocking voltage Schottky diode construction can be readily fabricated in BCD technology and with an SG8 process to yield a compact design. The described techniques and structures are suitable for a wide range of Schottky diode applications.

Figure 1:
FIG. 1 is a cross-sectional view of a portion of an integrated BCD Schottky diode having an L-shaped ring, field plates, and an n-type highly doped region with an open region according to the disclosure.

Referring to FIG. 1, a portion 100 a Schottky diode structure according to the disclosure includes a buried layer 108 formed within a substrate having a first type dopant, with the buried layer having a second type dopant. An epitaxial layer 112 is formed above the buried layer 108 and has the second type dopant. The structure 100 further includes an L-shaped ring 120 within the epitaxial layer 112. Field isolation 124 separates an anode region 128 from a cathode region 132.

It will be appreciated by those of ordinary skill in the art that not every layer and feature is shown in FIG. 1. For example, the substrate is not shown in FIG. 1. Diode portion 100 can provide half of the resulting Schottky diode which can have the illustrated structure mirrored to the left of the figure as will become apparent. FIG. 1 is intended to aid in describing features which are novel.

The field isolation 124 can be manufactured using different isolation solutions, such as local oxidation of silicon (LOCOS) or shallow trench isolation (STI). In an example embodiment, the field isolation layer 124 is an STI layer. A wider STI layer 124 can increase the diode blocking voltage.

Additional features can include field plates 134, 136, as shown. The field plates 134, 136 can be spaced from each other by an interlayer dielectric (ILD) 138.

In an example, the first type dopant can be p-type and the second type dopant can be N-type.

The L-shaped ring 120 covers a corner of the STI layer 124 adjacent to the anode 128, as shown. At least one dimension of the L-shaped ring 120 is adjustable and the blocking voltage of the Schottky diode is based at least in part on the adjustable dimension of the L-shaped ring. In an example, an adjustable dimension is a width "W" of the L-shaped ring that extends under the STI layer 124.

In an example, the L-shaped ring 120 is p-type and lightly-doped.

The buried layer 108 has an open region, or hole 110 that is substantially vertically aligned with the anode 128. The open region 110 of the buried layer 108 refers to an area of the buried layer 108 in which there is no N-type material. In this example, the hole 110 can be comprised of p-type material. The hole 110 increases the breakdown voltage arising from the contribution of the vertical electric field under the anode 128.

The open region 110 has an adjustable width as illustrated by an arrow extending horizontally through a dotted line side wall. The blocking voltage of the Schottky diode is based at least in part on the width of the open region 110.

Use of one or more of the L-shaped ring 120, the buried layer hole 110, the STI layer 224, and/or field plates 134, 136 can increase the breakdown voltage. All four of the features of the L-shaped ring 120, the hole 110, STI layer 224 and/or field plates 134, 136 can be provided. Alternatively, fewer than all four of these features can be provided in any combination. Which one or more of these features is provided and their material compositions and dimensions can be selected to optimize the desired breakdown voltage for a particular application.

Referring to FIGS. 2A-2D, stages of fabrication of a Schottky diode according to the disclosure is illustrated.

Figure 2A:
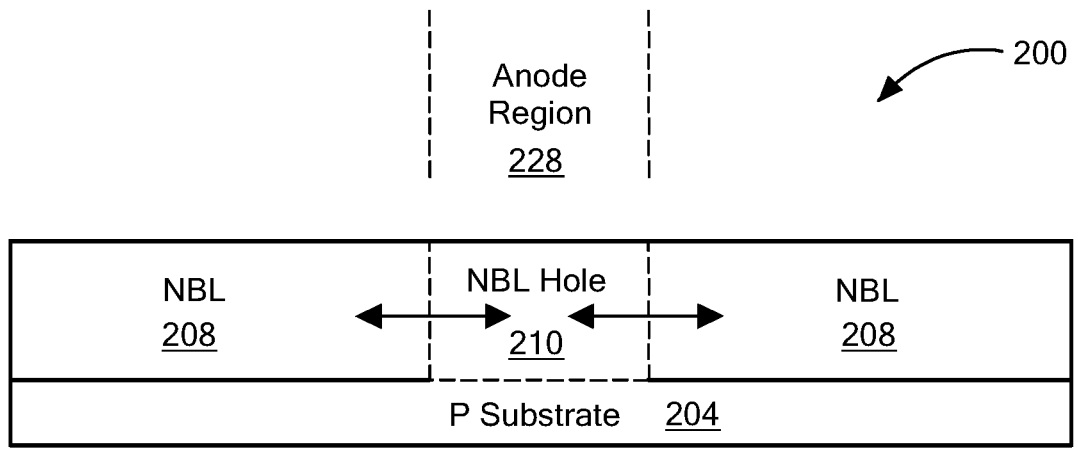
FIG. 2A is a cross-sectional view of a substrate and buried layer during fabrication of a Schottky diode according to the disclosure.

In FIG. 2A, a structure 200 in the fabrication of a Schottky diode includes a substrate 204. The substrate 204 can have a first dopant type, such as p-type silicon with a resistivity on the order of 5 ohm-cm.

Substrate 204 can be comprised of different semiconductor materials with proper doping concentration. As examples, the substrate 204 can be comprised of silicon. Alternatively, the substrate 204 can be comprised of crystalline semiconductor material, selected from silicon, Ge, AlGaN, InGaAs, GaAs, InAs, InP, AlN, InN, GaN, SiC, SiGe.

A buried layer 208 as may be the same as or similar to buried layer 108 is formed within the substrate 204. Buried layer 208 has a second type dopant, different than the first type dopant. In an example, the buried layer 208 is an n-type layer and can be referred to as NBL. Buried layer 208 can have a doping concentration on the order of between $10^{18}$-$10^{20}$ cm$^3$.

An open region, or hole 210, as may be the same as or similar to open region 110, is formed within the buried layer 208 under a region 228 that will become an anode region, which anode region may be the same as or similar to anode region 128. In other words, there is no buried layer material 208 in the hole 210. In an example in which the substrate 204 is p-type material, the hole 210 can be comprised of p-type material.

The width of the open region 210 can be tailored to coincide with the width of the anode region 228. However, it will be appreciated that the open region 210 is not required to be the same width as the anode region 228.

The width of the hole 210 can be adjusted to control the vertical electric field and thus, the blocking voltage. In an example, the hole width ranges from 1 um to 20 μm. To adjust the blocking voltage, the hole 210 can be smaller or larger than the anode size. Increasing the width of the hole 210 can increase the breakdown voltage.

Figure 2B:
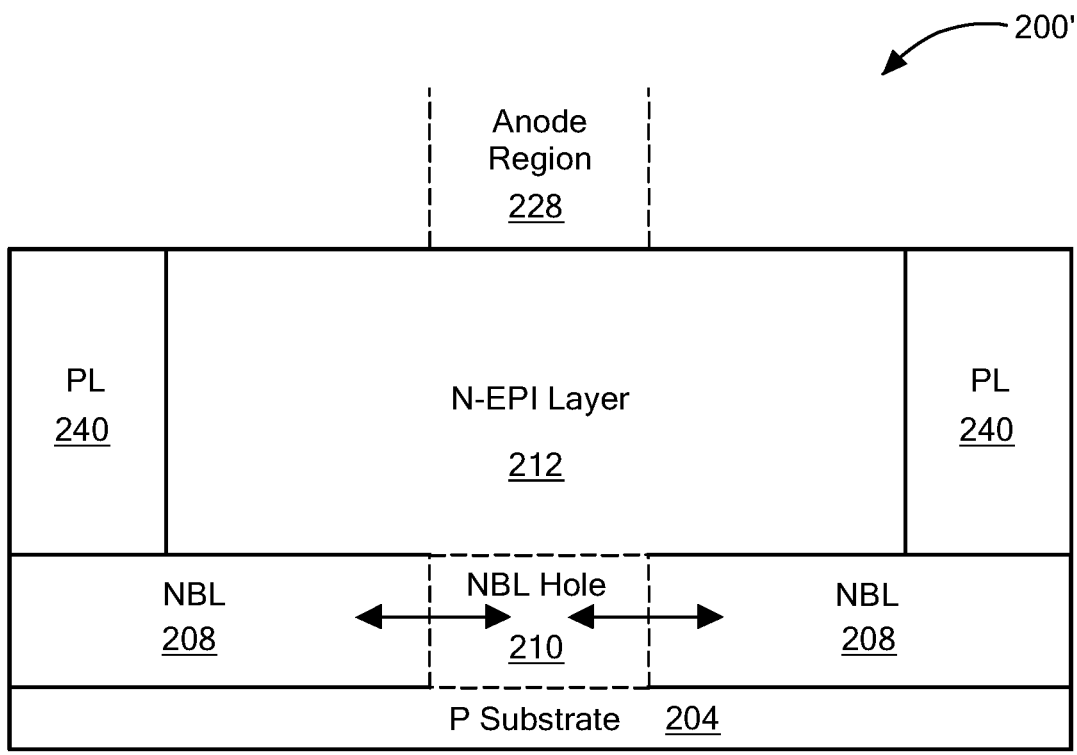
FIG. 2B is a cross-sectional view of the structure of FIG. 2A additionally including an epitaxial layer and plugs.

Referring to FIG. 2B, a further structure 200' during the Schottky diode fabrication shows that an epitaxial, or epi layer 212 is formed over the buried layer 208. The epi layer 212 has the second dopant type, such as n-type. In an example, the epi layer 212 has a thickness between approximately 5-10 μm and a resistivity on the order of 5 ohm-cm. The epi layer 212 is comprised of the same material as the substrate and thus, can be comprised of crystalline semiconductor material, selected from silicon, Ge, AlGaN, InGaAs, GaAs, InAs, InP, AlN, InN, GaN, SiC, SiGe The influence of the hole 210 on the blocking voltage is based at least in part on the thickness of the epi layer 212. In particular, the thinner the epi layer 212, the more significant the impact of the hole 210 on blocking voltage; whereas, the thicker the epi layer 212, the less significant the impact of the hole 210 on the blocking voltage. This interdependence may dictate that in embodiments with a thicker epi layer, blocking voltage tailoring may require use of the L-shape ring 220 and the field plates 234, 236.

A plug 240 can be implanted into the epi layer 212 to the depth of the NBL 208, as shown. Plug 240 defines the cathode region and the overall width of the Schottky diode (i.e., defines the device active area). In an example, the plug 240 can be ring-shaped and can have a concentration level on the order of $10^{20}$ cm$^{-3}$. Thus, the cathode region 232 can also be ring-shaped. The plug 240 may be in direct contact with the buried layer 208.

Figure 2C:
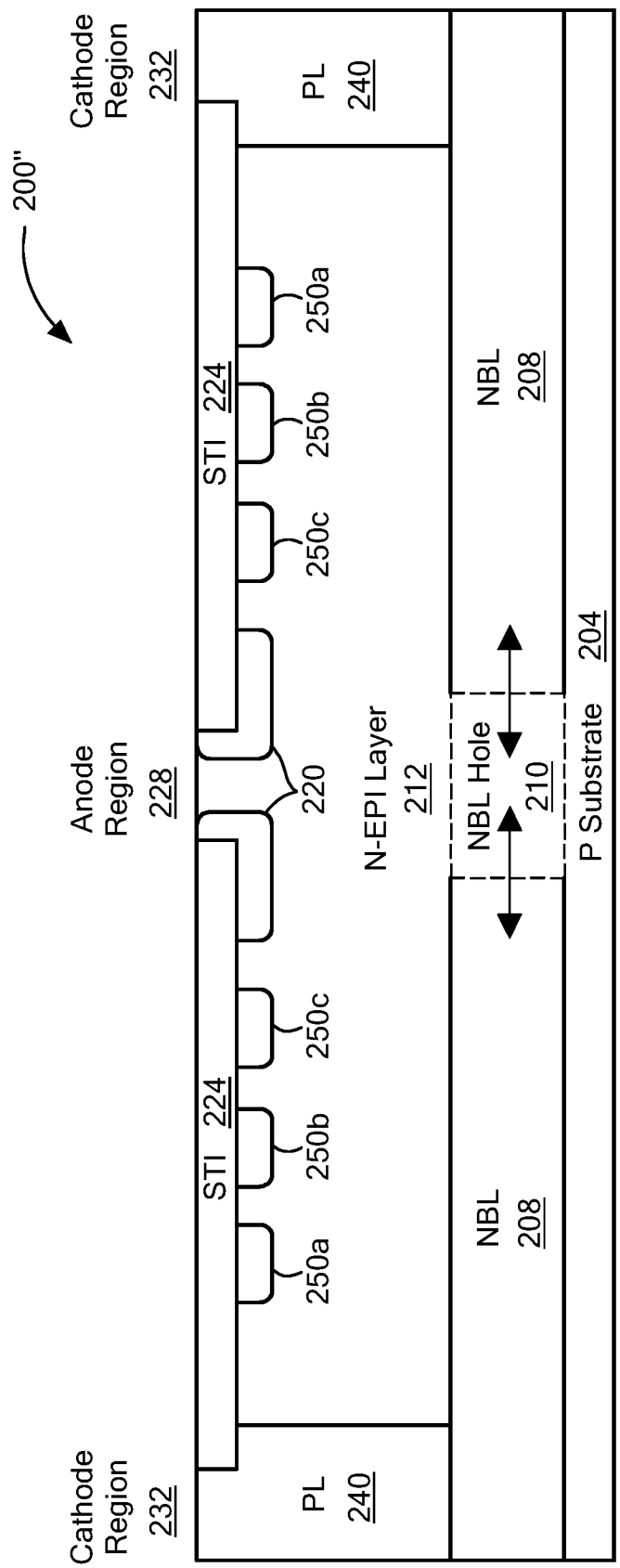
FIG. 2C is a cross-sectional view of the structure of FIG. 2B additionally including a shallow trench isolation (STI) layer and rings in the epitaxial layer, including an L-shaped ring.

Referring also to FIG. 2C, at a further stage of fabrication of the Schottky diode, structure 200" additionally includes an STI layer 224 formed at the surface region of the n-epi layer 212. STI layer 224 separates the anode region 228 from the cathode region 232. The dimensions of the field isolation layer 224 and the doping profile in the substrate 204 can play an important role in determining the reverse breakdown voltage of the diode. The material of the STI layer 224 is oxide. The size of the STI layer 224 plays an important role in the breakdown voltage. In particular, a wider STI layer 224 is useful to reduce the surface electric field and higher breakdown voltage can be achieved. In one example, the STI layer 224 is ring-shaped.

L-shaped ring 220 is formed around the corner of the STI layer 224 between the anode region 228 and the STI layer 224, as shown. The L-shaped ring 220 can be a p-type dopant and can be ring-shaped. Ring 220 serves to suppress the electric field around the edge and the corner of the field isolation 224 when the diode is reverse biased. The L-shaped ring 220 extends in the area under the field isolation 224 and can also facilitate the charge balance in the N-epi layer 212. Charge balance means the net charge (the sum of positive and negative charge) is zero or roughly zero in the depletion region. With charge balance, the spatial distribution of the electric field will be more gradual. As a result, higher breakdown voltage will be achieved.

As described above, a dimension of the L-shaped ring 220 can be adjusted in order to adjust the breakdown voltage. In particular, a dimension width (labeled "W" in FIG. 1) by which the L-shaped ring 220 extends under the STI layer 224 can be adjusted to thereby adjust the blocking voltage. The width of the L-shaped ring 220 can be between 11 μm to STI width, depending on application need. The larger the L-shaped ring width, the higher the breakdown voltage.

Multiple p-type lightly-doped rings, or ring-shaped regions, here regions 250a, 250b, 250c, are located under the STI layer 224. The size and spacing of each p-type ring 250a, 250b, 250c is adjustable. Like the L-shaped ring 220, rings 250a-250c can also balance the charge in the N-epi layer 212 and can have adjustable dimensions and spacing in order to further increase the blocking voltage.

The number of ring-shaped regions, here three regions 250a, 250b, 250c, is only for illustration purposes. One of ordinary skill in the art would recognize that the number of rings 250a-250c may be much higher than is shown in FIG. 2D.

Additional rings 250a-250c can increase the depletion region, thereby increasing the blocking voltage. Advantageously, rings 250a-250c can be fabricated at the same time as the L-shaped ring 220 by opening additional areas of the mask layer.

The p-type L-shaped ring 220 and multiple p-type rings 250a-250c can be implemented with doping concentrations of between $10^{15}$ cm$^{-3}$ to $5 \times 10^{17}$ cm$^{-3}$.

Figure 2D:
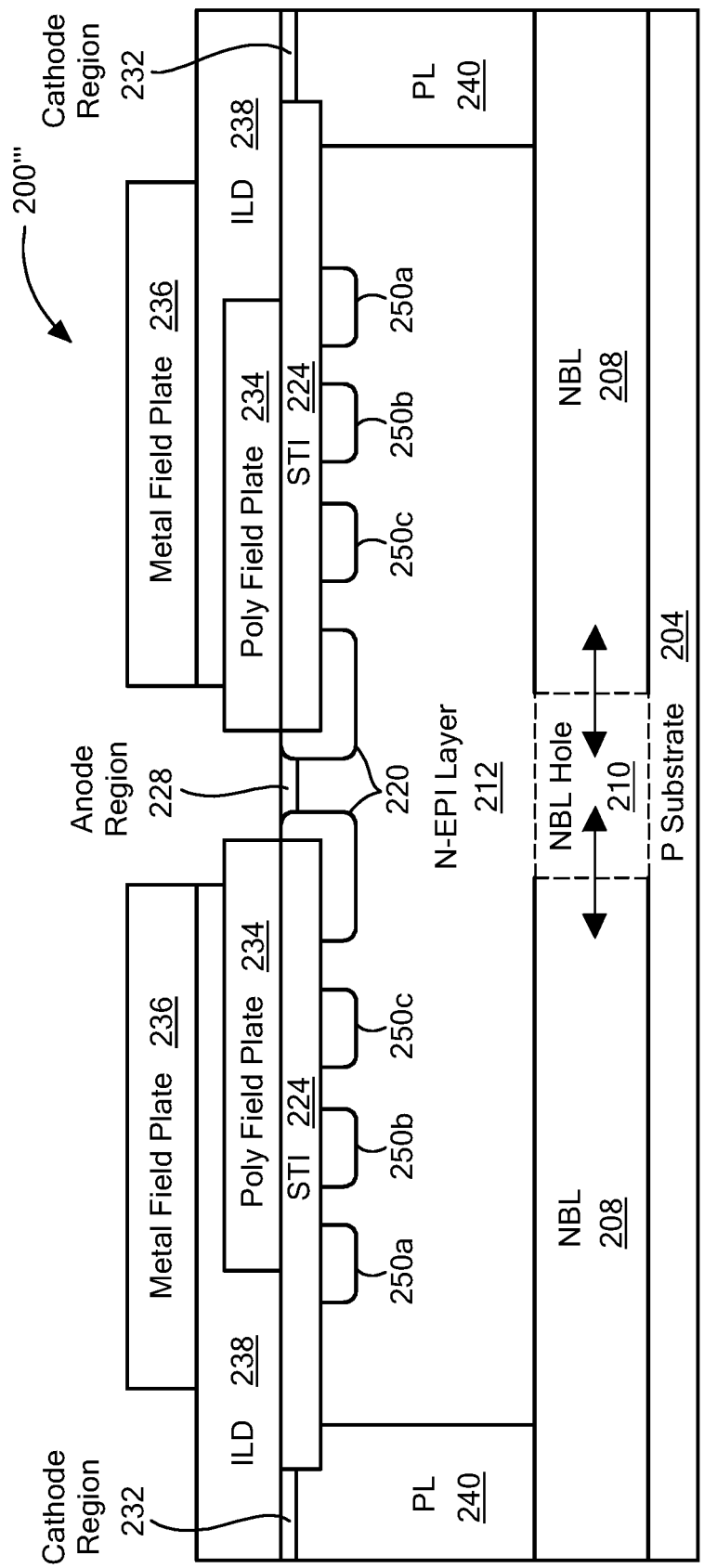
FIG. 2D is a cross-sectional view of the structure of FIG. 2C additionally including field plates.

Referring also to FIG. 2D, the completed Schottky diode structure 200''' additionally includes field plates 234, 236. The field plates 234, 236 can include polysilicon field plate 234, an ILD layer 236 formed over the poly field plate 234, and metal field plate 236 formed over the ILD layer, such that the ILD layer separates field plate 234 from field plate 236, as shown. Field plates 234, 236 can suppress the electric field near the interface between the field isolation 224 and the epi layer 212. In particular, the polysilicon field plate 234 helps to suppress the electric field in the N-epi layer 212, especially the region close to cathode 232. With lower electric field, higher breakdown voltage and better device reliability can be achieved.

The anode and cathode 228, 232 can be metal silicide. In an example, the anode and cathode regions 228, 232 are comprised of a cobalt silicide, such as CoSi$_2$, Co$_2$Si, or CoSi. Alternatively, the anode and cathode regions 228, 232 can be comprised of other metal silicides, such as nickel silicide, titanium silicide, or tungsten silicide. The metal silicide serves as the Schottky metal contact at the anode region 228 and serves as an ohmic contact at the cathode region 232. The cathode 232 is heavily doped to minimize the contact resistance.

The described SG8 BCD-technology-based integrated Schottky diode 200''' with L-shaped ring 220, NBL hole 210, and field plates 234, 236 can be designed for voltage ratings from 20V to 120V.

The breakdown voltage may be tunable based on mask level changes. In one example, the width of the L-shaped ring 220 can control the breakdown voltage. In another example, the width of the hole 210 can control the breakdown voltage.

As noted, above, any one or more of the L-shaped ring 220, hole 210, STI layer 224, and field plates 234, 236 can be useful in extending the breakdown voltage of the Schottky diode 200'''. In particular, each of these features alone or in combination can result in quicker and more uniform depletion. Further, the L-shaped ring 220 can reduce the electric field at the corner of the STI layer 224.

Figure 3:
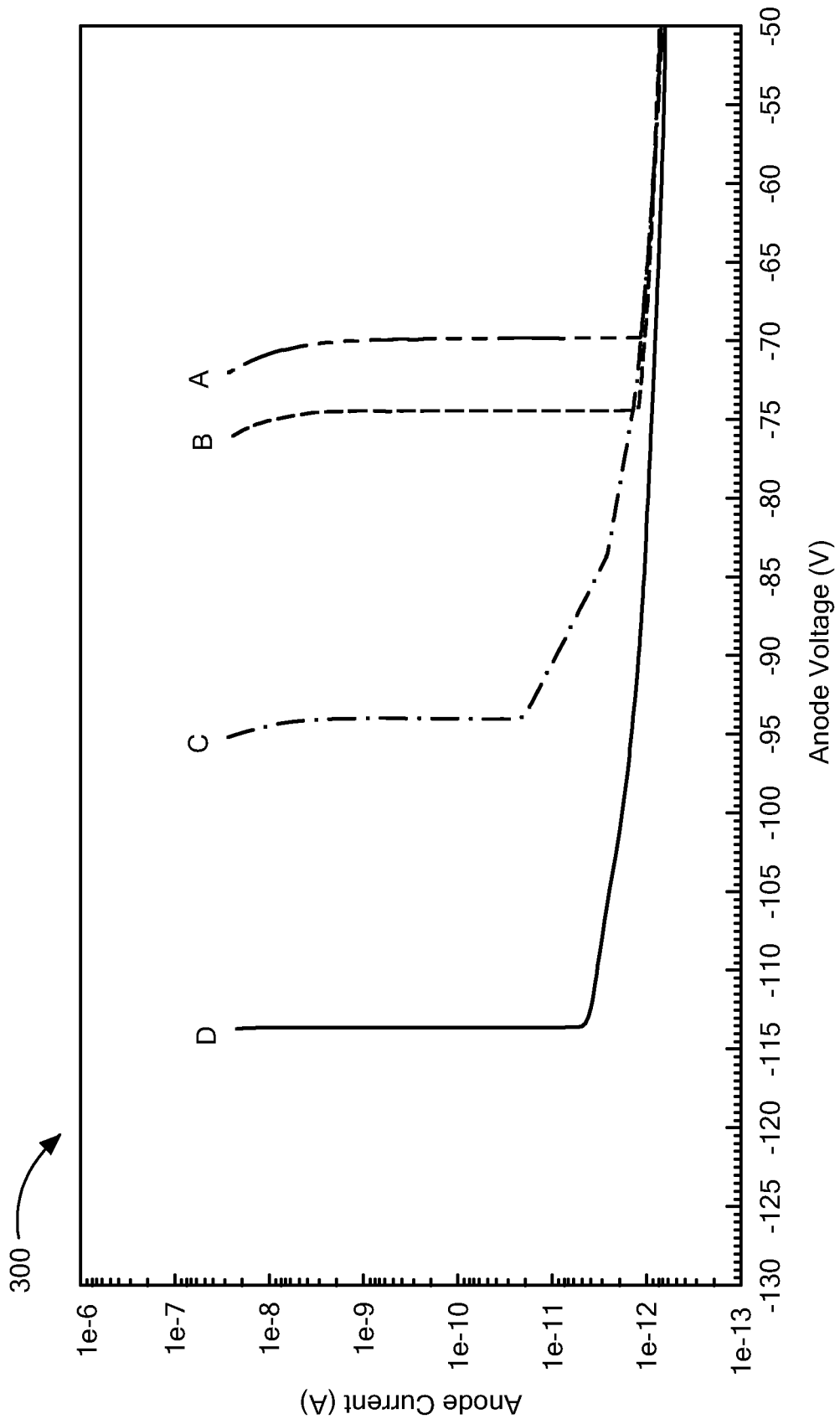
FIG. 3 is a graph illustrating the effect of the L-shaped ring and field plates on the breakdown voltage of the Schottky diode.

Referring also to FIG. 3, a graph 300 illustrates breakdown parameters for different Schottky diode features and feature dimensions. Breakdown voltage is shown on the horizontal axis in units of volts and breakdown current is shown on the vertical axis in units of amperes.

As noted above, the Schottky diode's blocking voltage is adjustable at least by tuning dimensions of p-type L-shaped ring 220 and dimensions of n-type buried layer hole 210 and by providing field plates 234, 236, and STI layer 224.

Curves A and B illustrate breakdown parameters for different widths of the L-shaped ring 220 without polysilicon field plate 234 and without metal field plate 236. In particular, curve A corresponds to an L-shaped ring width of 2 μm and curve B corresponds to a larger L-shaped ring width of 3 μm. Consideration of curves A and B reveals that a wider L-shaped ring 220 results in a higher breakdown voltage.

Curves C and D illustrate breakdown parameters with and without the NBL hole 210 present. In particular, curve C corresponds to not having an NBL hole present and curve D corresponds to having an NBL hole of an example width of 10 μm. Consideration of curves C and D reveals that providing an NBL hole 210 results in a higher breakdown voltage.

Consideration of curves C and D with respect to curves A and B reveals that significant blocking voltage enhancement results from use of field plates 234, 236. In particular, when the field plates 234, 236 are utilized, the Schottky diode breakdown voltage is increased as shown in curve C but is still lower than 100V. By providing the NBL hole 210 as illustrated in curve D, the breakdown voltage can be higher than 110V.

It will be appreciated by those of ordinary skill in the art that the described adjustable high breakdown voltage Schottky diode 200''' is suitable for a variety of applications. As a non-limiting example, the described Schottky diode can be used to protect a power MOSFET from switching-off avalanche current. More particularly, as a power MOSFET is switched off in a circuit with an inductive load, high voltage is induced by avalanche across the drain to source terminals. If the high voltage exceeds the maximum voltage that the MOSFET can sustain, the device be damaged. Coupling the described Schottky diode structure in parallel with the power switching circuit to bypass the inductive avalanche current can protect the power MOSFET.

In another non-limiting application example, the described Schottky diode 200''' can be used as a Transient Voltage Suppressor (TVS) for high-speed circuit protection. With the described SG8 BCD-technology-based integrated Schottky diode 200''' with L-shaped ring 220 and field plates 234, 236 providing a breakdown voltage over 110V, high-voltage and high-speed application requirements can be met.

Having described example embodiments, which serve to illustrate various concepts, structures, and techniques, which are the subject of this patent, it will now become apparent to those of ordinary skill in the art that other embodiments incorporating these concepts, structures and techniques may be used.

By way of a non-limiting example, the dopant type of the layers can be reversed (e.g., the substrate can be n-type and the buried layer can be p-type, in which case the above-described N Schottky diode becomes a P Schottky diode).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A Schottky diode comprising:
a substrate having a first type dopant;

a buried layer within the substrate and having a second type dopant;

an epitaxial layer above the buried layer and having the second type dopant;

a plurality of rings within the epitaxial layer and having the first type dopant, wherein the plurality of rings comprises an L-shaped ring;

a shallow trench isolation (STI) layer at the top region of the epitaxial layer;

an anode;

a cathode spaced from the anode by the STI layer; and wherein the buried layer has an open region substantially vertically aligned with the anode.

2. The Schottky diode of claim 1, wherein the L-shaped ring covers a corner of the STI layer adjacent to the anode.

3. The Schottky diode of claim 2, wherein a dimension of the L-shaped ring is adjustable and wherein a blocking voltage of the Schottky diode is based at least in part on the dimension of the L-shaped ring.

4. The Schottky diode of claim 3, wherein the dimension of the L-shaped ring is a width of the L-shaped ring that extends under the STI layer.

5. The Schottky diode of claim 1, wherein the open region of the buried layer has an adjustable width and wherein a blocking voltage of the Schottky diode is based at least in part on the width of the open region.

6. The Schottky diode of claim 1, further comprising at least one field plate above the STI layer.

7. The Schottky diode of claim 1, further comprising at least one plug in contact with the buried layer.

8. The Schottky diode of claim 1, wherein the first type dopant is p-type and wherein the second type dopant is n-type.

9. The Schottky diode of claim 1, wherein the substrate is comprised of silicon.

10. The Schottky diode of claim 1, wherein the substrate and the epitaxial layer are comprised of a crystalline semiconductor material, selected from silicon, Ge, AlGaN, InGaAs, GaAs, InAs, InP, AlN, InN, GaN, SiC, SiGe.

* * * * *

UNITED STATES PATENT AND TRADEMARK OFFICE
CERTIFICATE OF CORRECTION

| | | |
|---|---|---|
| PATENT NO. | : 12,119,413 B2 | Page 1 of 1 |
| APPLICATION NO. | : 17/819957 | |
| DATED | : October 15, 2024 | |
| INVENTOR(S) | : Yu-Chun Li et al. | |

It is certified that error appears in the above-identified patent and that said Letters Patent is hereby corrected as shown below:

In the Specification

Column 4, Line 67, delete "11 μm" and replace with --1 μm--.

Signed and Sealed this
Twenty-ninth Day of April, 2025

Coke Morgan Stewart
*Acting Director of the United States Patent and Trademark Office*